US010942222B1

(12) United States Patent
Bonen

(10) Patent No.: US 10,942,222 B1
(45) Date of Patent: Mar. 9, 2021

(54) ESTIMATING A LIFESPAN OF A POWER SUPPLY

(71) Applicant: Harmonic, Inc., San Jose, CA (US)

(72) Inventor: Adi Bonen, Belle Mead, NJ (US)

(73) Assignee: Harmonic, Inc., San Jose, CA (US)

( * ) Notice: Subject to any disclaimer, the term of this patent is extended or adjusted under 35 U.S.C. 154(b) by 529 days.

(21) Appl. No.: 15/846,926

(22) Filed: Dec. 19, 2017

Related U.S. Application Data

(60) Provisional application No. 62/436,381, filed on Dec. 19, 2016.

(51) Int. Cl.
*G01R 31/36* (2020.01)
*G01R 31/392* (2019.01)
*G01R 31/374* (2019.01)

(52) U.S. Cl.
CPC ....... *G01R 31/392* (2019.01); *G01R 31/3648* (2013.01); *G01R 31/374* (2019.01)

(58) Field of Classification Search
CPC . G01R 31/392; G01R 31/374; G01R 31/3648
See application file for complete search history.

(56) References Cited

U.S. PATENT DOCUMENTS

| | | | | | |
|---|---|---|---|---|---|
| 6,687,627 | B1* | 2/2004 | Gunn | .................. | G01R 21/133 324/500 |
| 8,560,762 | B2* | 10/2013 | Panabaker | ............ | G06F 1/3203 711/103 |
| 10,139,845 | B2* | 11/2018 | Dzuban | ..................... | G05F 1/66 |
| 2012/0011378 | A1* | 1/2012 | Dalton | ................. | G06F 11/328 713/300 |
| 2013/0033102 | A1* | 2/2013 | Goff | .................... | H01M 10/482 307/10.6 |
| 2013/0090900 | A1* | 4/2013 | Gering | ................. | G01R 31/392 703/2 |
| 2013/0283289 | A1* | 10/2013 | Adinarayan | .......... | G06F 9/5094 718/105 |
| 2013/0342355 | A1* | 12/2013 | Lund | ....................... | H04W 4/70 340/870.01 |
| 2016/0021013 | A1* | 1/2016 | Vasseur | ............... | H04L 41/0677 370/235 |
| 2016/0261131 | A1* | 9/2016 | Childress | ............. | H02J 7/0021 |
| 2016/0300148 | A1* | 10/2016 | Kelly | .................... | G06F 11/008 |
| 2017/0068792 | A1* | 3/2017 | Reiner | ................... | A61N 1/362 |
| 2017/0188308 | A1* | 6/2017 | Nolan | .................. | H04L 43/106 |
| 2018/0076662 | A1* | 3/2018 | Maheshwari | ..... | H02J 13/00002 |

OTHER PUBLICATIONS

Kurschl et al., Combining Cloud Computing and Wireless Sensor Networks, iiWAS 2009 Short Papers, pp. 512-518, 2009 (Year: 2009).*

* cited by examiner

*Primary Examiner* — Raymond L Nimox
(74) *Attorney, Agent, or Firm* — Brokaw Patent Law PC; Christopher J. Brokaw

(57) ABSTRACT

Estimating a lifespan of a power supply. An internal computerized component periodically obtains a set of measurements read from one or more sensors affixed to a power supply. Such measurements may measure ambient temperature, temperature of an electrolytic capacitor of a power supply, voltage across a power supply, and/or current from the power supply. The internal computerized component analyzes the set of measurements using, at least in part, a weighted set of factors, to obtain an estimate of a lifespan of a power supply. The estimated lifespan may be sent over an optical link or wireless network to an entity monitoring the lifespan of the power supply.

25 Claims, 4 Drawing Sheets

ESTIMATING A LIFESPAN OF A POWER SUPPLY

CLAIM OF PRIORITY AND RELATED APPLICATION DATA

This application claims priority to U.S. Provisional Patent Application Ser. No. 62/436,381, filed Dec. 19, 2016, entitled "CableOS Smart Node ('Ripple')," the contents of which are hereby incorporated by reference for all purposes as if fully set forth herein.

This application is related to U.S. Non-provisional Patent Application Ser. No. 15/846,989, entitled, "Detecting Imminent Failure in a Power Supply," invented by Adi Bonen, filed on Dec. 19, 2017, the entire disclosure of which is hereby incorporated by reference for all purposes as if fully set forth herein.

FIELD OF THE INVENTION

Embodiments of the invention relate to estimating a lifespan of a power supply.

BACKGROUND

A Converged Cable Access Platform (CCAP) is an industry standard platform for transmitting video data and voice content. The CCAP is led by CableLabs of Sunnyvale, Calif. CCAP unifies the Converged Multiservice Access Platform (CMAP), managed by Comcast Corporation of Philadelphia, Pa., with the Converged Edge Services Access Router platform (CESAR), which is managed by Time Warner Cable, Inc of New York, N.Y.

CableLabs has publicly issued a Remote PHY family of specifications, known as the MHAv2 specifications (Modular Headend Architecture version 2). These specifications describe how a CCAP platform may be separated into two components, (1) a CCAP Core located at a cable headend, and (2) a Remote PHY device (RPD), which is typically located outdoors. A RPD may be located, for example, at the junction of the fiber and coax plants in an optical node serving as a Remote PHY Node (RPN). A CCAP core can control and setup data paths with multiple RPDs situated in multiple fiber nodes. FIG. 1 is a block diagram of a CCAP platform which includes an RPD situated inside an RPN in accordance with the MHAv2 specifications of the prior art.

CableLabs has also issued a technical report about the R-MACPHY architecture and is currently undertaking an effort to formalize a specification for R-MACPHY products, specifically a Remote MACPHY Device (RMD) which resides in a Remote MACPHY node (RMN). This technical report describes Remote MACPHY (or MAC-PHY) as a generic term given to the distributed CMTS/CCAP architecture where the DOCSIS MAC and PHY layer processing of a CMTS are moved from the headend down to a Fiber Node location.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for estimating a lifespan of a power supply are presented herein. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

Embodiments of the invention may be used to ascertain a remaining lifespan of a power supply. While embodiments of the invention may be used upon a wide variety of power supplies in many different contexts, the approaches discussed herein have particular utility in contexts where the power supply is powering an electronic device coupled to a network. The approaches discussed herein may be used with power supply in many different contexts, such as without limitation, a power area deployed in a remote area, a power supply in a CATV plant, a power supply in an optical node, a power supply in a smart optical node, and a power supply supplying power to a computerized device. For purposes of providing a concrete example, certain embodiments of the invention will be discussed with reference to implementing the invention within a Remote PHY node; however, embodiments of the invention may be employed with power supplies in other contexts and environments. For example, certain embodiments may be employed at a Remote MAC-PHY node (RMN). As another example, other embodiments may be employed at Optical Line Terminal (OLT) node or a 802.11n Wi-Fi Access Point.

Figure 1:
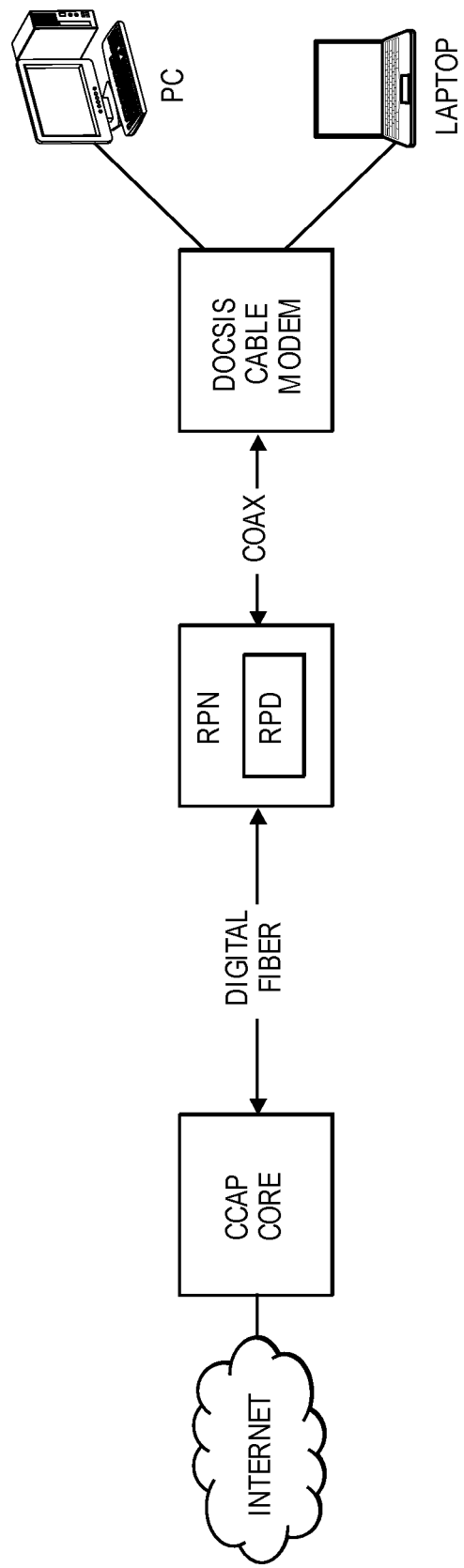
FIG. 1 is a block diagram of a CCAP platform which includes a Remote PHY device (RPD) in accordance with the MHAv2 specifications of the prior art.
Figure 2:
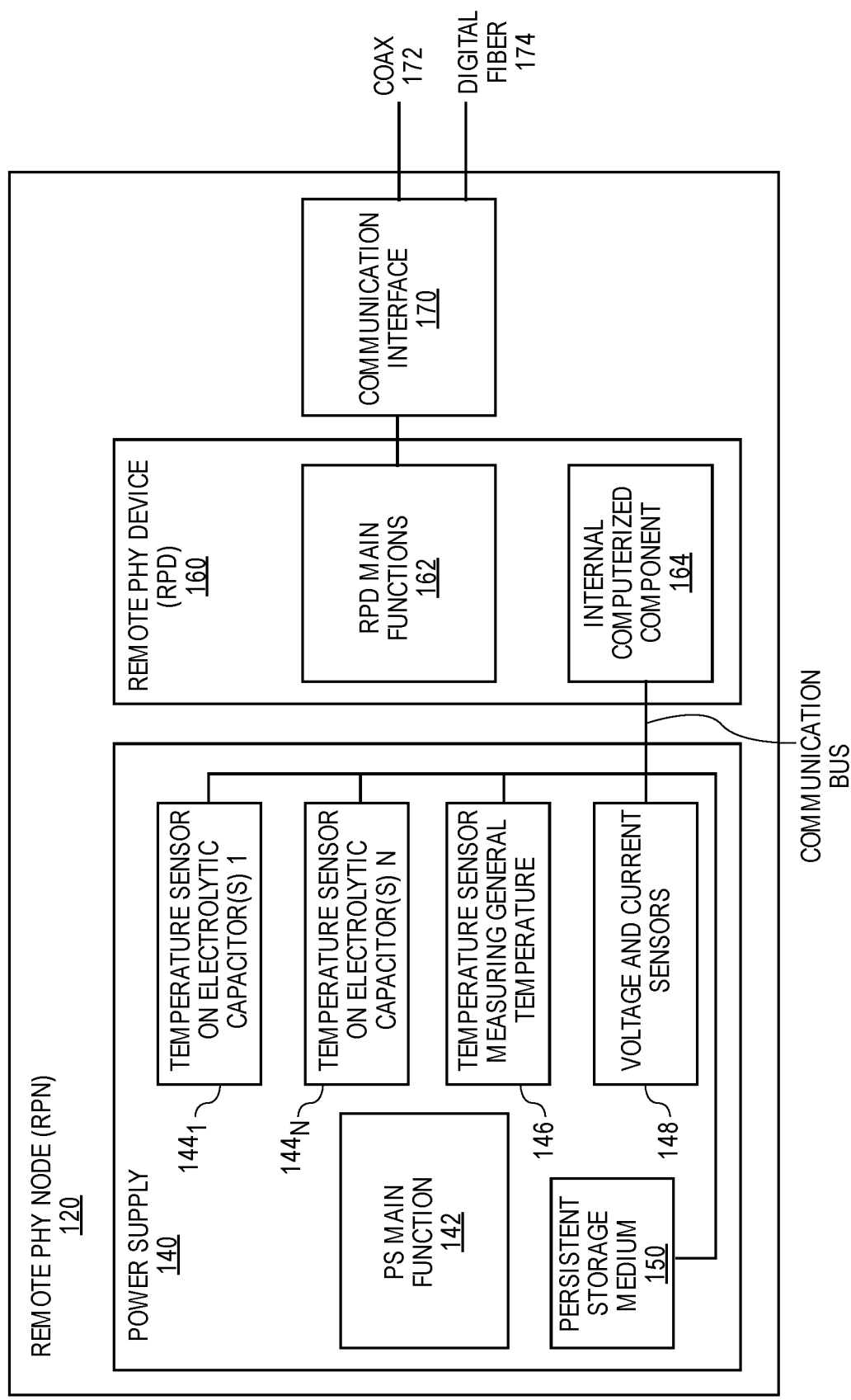
FIG. 2 is a block diagram of a Remote PHY node (RPN) which includes a power supply and a Remote PHY device (RPD) according to an embodiment of the invention.

FIG. 2 is a block diagram of a Remote PHY node (RPN) 120 according to an embodiment of the invention. The function of RPN 120 is to convert downstream DOCSIS data, MPEG video, and out-of-band (OOB) signals from digital to analog one way and transmit them over a plurality of coaxial cables 172 leading to cable subscribers' homes, and receive upstream data, video, and OOB signals from coaxial cables 172 in analog format and convert them to digital the other way. The digital signals are exchanged between the CCAP Core and the RPD, comprised within the RPN, typically over digital fiber 174. RPN 120 may send and receive data over communication links, such as coaxial cables 172 and/or digital fiber 174, using communication interface 170.

Remote PHY nodes, such as RPN 120, are designed to be deployed outdoors near the physical area to be serviced by RPN 120. A non-limiting, illustrative example of RPN 120 includes Harmonic, Inc.'s CableOS™ Ripple-1 Remote PHY node.

RPN 120 is composed of an outer housing that surrounds at least one power supply 140 and at least one Remote Device (RPD) 160. The outer housing of RPN 120 is designed to provide a hermetically sealed environment to the interior of RPN 120. The hermetically sealed environment provided by the outer housing of RPN 120 helps protect internal components such as power supply 140 and RPD 160 from outdoor environmental factors, such as humidity, water, debris, and changes in pressure.

RPN 120 comprises an optical network transceiver (SFP), but embodiments may also be employed in contexts where access to other types of communication interface, such as a wireless network, instead of or in addition to the optical network, is available. In addition to data transmitted through the RPD 120 to and from cable subscribers, and in addition to communications required to fulfill the operation of the RPD Main Functions 162, Internal Computerized Component 164 of the RPD may send and receive data communications over the optical network (or over a wireless network in contexts where such a network is available). This advantageously allows an operator or technician to send and receive data to RPN 120 deployed in the field, such as for purposes of configuring the operation of RPN 120, providing additional or revised data or executable instructions to RPN 120, and/or receiving information about the lifespan of power supply 140.

Power supply 140 inside RPN 120 also comprises a plurality of temperature sensors $144_1$ to $144_N$ dispersed over different locations of power supply 140. Such temperature sensors $144_1$ to $144_N$ and 146 may measure the temperature in the interior of power supply 140 at different locations. A portion of temperature sensors $144_1$ to $144_N$ are positioned such that the temperature of critical components may be measured, which shall be discussed below in greater detail in relation to FIG. 3. Certain temperature sensor(s) 146 should be able to measure or provide a sufficient estimation of the temperature of the ambient air inside power supply 140. Further, a portion of temperature sensors $144_1$ to $144_N$ should be positioned on components within power supply 140, such as each electrolytic capacitor which forms part of power supply 140, so that the temperature of those components may be directly measured.

Figure 3:
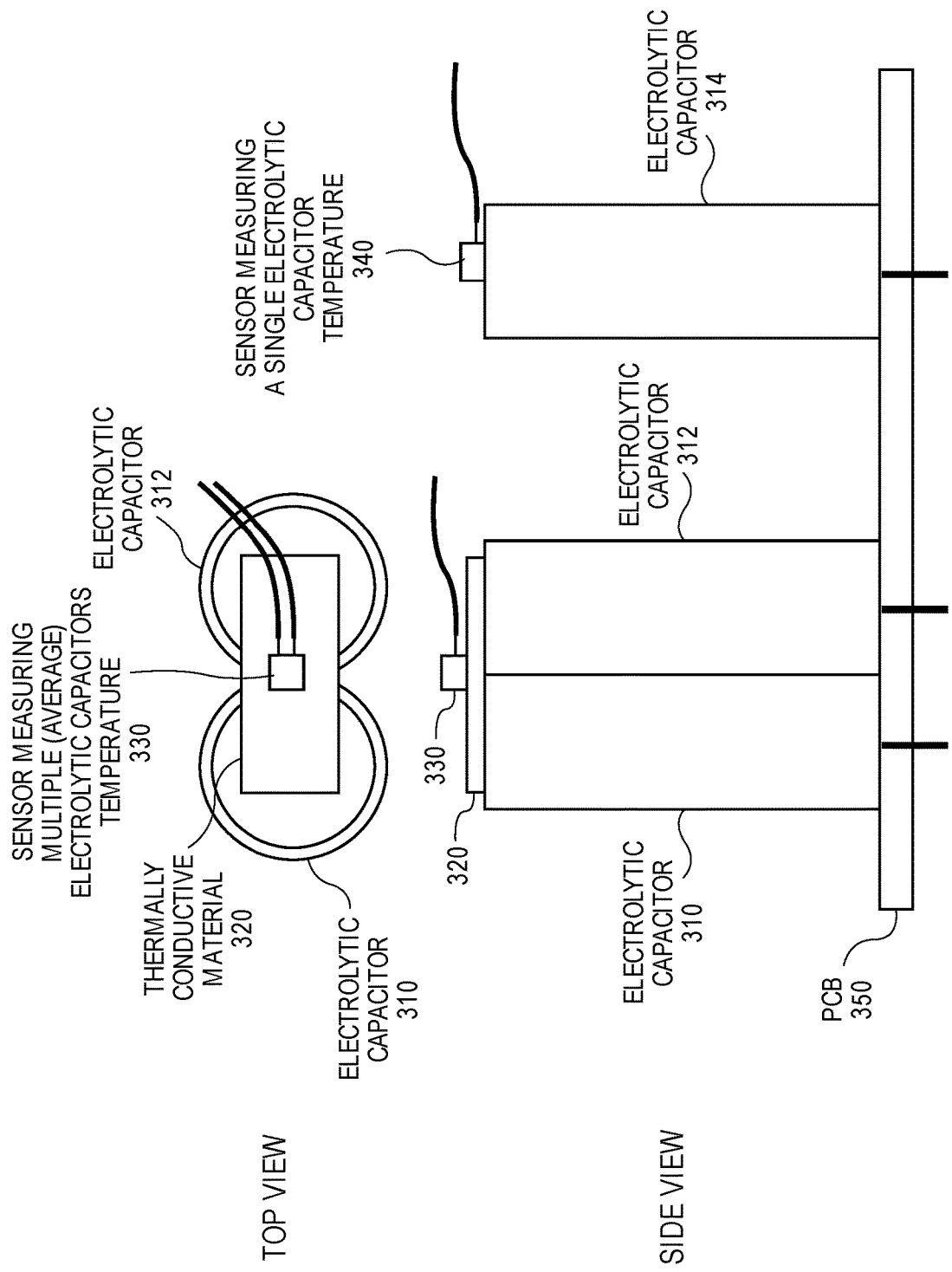
FIG. 3 is an illustration of exemplary temperature sensors disposed on electrolytic capacitors inside a power supply, according to an embodiment of the invention.

FIG. 3 is an illustration of electrolytic capacitors inside a power supply, and exemplary temperature sensors disposed therein, according to an embodiment of the invention. Power supply 140 may be constructed using one or more electrolytic capacitors, with most power supplies comprising a plurality of electrolytic capacitors. For example, FIG. 3 depicts a side view of a power supply comprised of three electrolytic capacitors 310, 312 and 314, which their temperature is measured by two temperature sensors. Electrolytic capacitors 310 and 312 are also depicted in FIG. 3 using a top view to further describe the method by which a single temperature sensor can measure average temperature across a plurality of electrolytic capacitors. The lifespan of the power supply is largely dictated by the lifespan of the electrolytic capacitors used to construct the power supply.

An electrolytic capacitor is made using two different aluminum layers separated by liquid electrolyte material. The lifespan of an electrolytic capacitor may end when the liquid electrolyte material, included within the aluminum layers of the electrolytic capacitor, dries out and exsiccates. The rate of which the liquid electrolyte material dries out and exsiccates is affected by the long-term temperature experienced by the liquid electrolyte material. The long-term temperature experienced by the liquid electrolyte material corresponds to the external environmental temperature (i.e., the temperature at the location where RPN 120 is deployed) over time and the temperature rise of the electrolytic capacitor itself over time.

The temperature of an electrolytic capacitor may rise over time due to ripple current through the electrolytic capacitor's equivalent series resistance (ESR). As an electrolytic capacitor dries out and approaches the end of its lifespan, its ESR rises. The rising ESR of the electrolytic capacitor causes an increase in internal temperature due to the flow of current through the increased resistance. As a result, as an electrolytic capacitor nears the end of its lifespan, the electrolytic capacitor experiences an exponential acceleration of its rising temperature and ESR. Embodiments of the invention may employ these principles in estimating the lifespan of the power supply of a RPD.

FIG. 3 depicts a temperature sensor 330 disposed on a thermally conductive material 320 on electrolytic capacitors 310 and 312 inside a power supply. Use of thermally conductive material 320 is useful when thermally connecting two or more electrolytic capacitors, as temperature sensor 330 may measure the average temperature of both electrolytic capacitors 310 and 312. Use of thermally conductive material 320 is optional when both capacitors are expected to have similar behavior and lifespan, such as when they are identical and are connected in parallel. FIG. 3 also depicts a temperature sensor 340 disposed directly on an electrolytic capacitor 314. A power supply be coupled to, or disposed upon, a printed circuit board 350 or other electrical conductor or component for purposes of supply electrical power thereto. As shown in FIG. 2, RPN 120 also comprises Remote RHY device 220, which is a device which performs many of the functions involved in converting downstream DOCSIS data, MPEG video, and out-of-band (OOB) signals from digital to analog and upstream data, video, and OOB signals from analog to digital. These functions are depicted in FIG. 2 as being performed by RPD main functions 162. RPD 160 may also comprise internal computerized component 164, which is responsible for certain responsibilities discussed herein, such as obtaining measurements from temperature sensors $144_1$ to $144_N$, temperature sensor(s) 146, and voltage and current sensors 148. A non-limiting, illustrative example of Remote RHY device 220 is Harmonic, Inc.'s CableOS™ Pebble-1 Remote PHY device.

Figure 4:
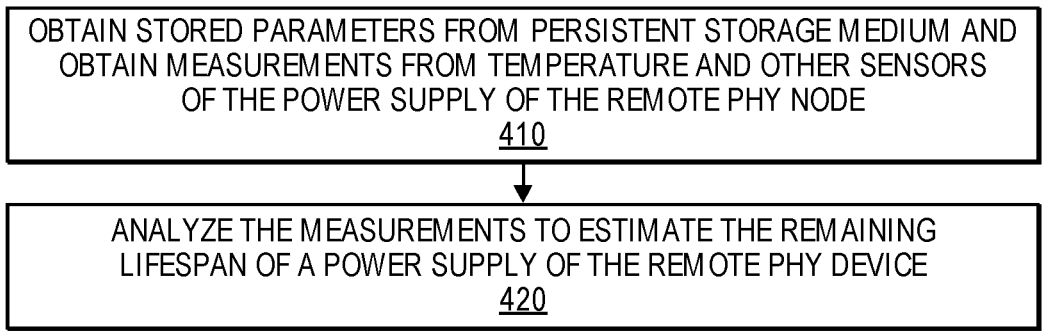
FIG. 4 is a flowchart illustrating the functional steps of estimating a lifespan of the power supply according to an embodiment of the invention.

FIG. 4 is a flowchart illustrating the functional steps of estimating a lifespan of the power supply of a Remote PHY node (RPD) 120 according to an embodiment of the invention. The steps of FIG. 4 may be used to ascertain when it is reasonable or appropriate to replace a power supply of RPN 120 in the course of regular maintenance.

In step 410, critical parameters are retrieved from persistent storage medium 150 inside the power supply and a measurement is obtained from one or more temperature and other sensors $144_1$ to 144N, 146 and 148. Temperature sensors 146 should obtain temperature measurements of the ambient air within power supply 140. In addition, temperature sensors $144_1$ to $144_N$ should obtain a direct measurement of the temperature of the electrolytic capacitor within power supply 140. Furthermore, information stored in persistent storage medium 150 in power supply 140 is obtained by internal computerized component 164. Such information may include parameters required for power supply lifespan and stress estimation specific to the power supply for which it is estimated, as well as historical lifespan and stress calculations that were previously stored in the power supply.

In embodiments, measurements may be taken from temperature sensors $144_1$ to $144_N$ and 146 repeatedly at regular intervals of time. As a result, a running data set of the temperatures measured by temperature sensors $144_1$ to $144_N$ and 146 may be gathered. This running data set documents the temperature of components and/or at various locations within RPN 120. Other power supply measurements such as voltages and currents may also be taken using voltage and current sensors 148 to gather a running data set of the stress level experienced by the power supply.

In one embodiment, temporary measurements recorded by temperature sensors $144_1$ to $144_N$ and 146 and optionally by voltage and current sensors 148 in step 410 are temporarily stored, with the set of any previously obtained measurements, in internal computerized component 164, e.g., in a temporary storage medium for storing digital data, such that analysis in step 420 can be performed less frequently than the rate of obtaining the power supply sampled measurements. Such may be required in order to reduce the rate at which the result of the analysis is stored in a persistent storage medium 150 in order to reduce its wear.

In step 420, internal computerized component 164 analyzes the set of measurements stored therein, and the parameters retrieved from persistent storage medium 150 in step 410, to obtain an estimate of a lifespan of a power supply. An electrolytic capacitor's lifespan is normally specified as a number of operating hours at the electrolytic capacitor's maximum rated operating temperature. By analyzing the running temperature at which components operated at over time, the remaining lifespan of the electrolytic capacitor may be estimated.

Based on Arrhenius' Law, the actual life of an aluminum electrolytic capacitor is temperature dependent and is doubled for every 10° C. reduction of its temperature. In an embodiment, internal computerized component 164 may analyze the stored measurements describing the temperatures measured by temperature sensors $144_1$ to $144_N$ and 146 over time to estimate the remaining lifespan of the electrolytic capacitor using, at least in part, a weighted set of factors. Such factors include without limitation, for example, (1) how long power supply 140 of RPN 120 experienced a particular ambient temperature, (2) how long a particular component, such as location on a particular electrolytic capacitor, experienced a particular temperature, (3) the ripple current experienced by the capacitor at that time, and (4) an estimated ESR of a particular electrolytic capacitor. Note that the calculation of the lifespan of a power supply is, or may be, accumulative. In an embodiment, what is calculated in every calculation cycle is how much life was "depleted" since the previous calculation. The power supply starts with a certain amount of life, which is stored in persistent storage medium 150, and every calculation cycle internal computerized component 164 reduces the "depleted" amount from the previous "remaining lifespan" and stores a new "remaining lifespan" in the persistent storage medium.

Further, as certain types of persistent storage mediums have a limited number of write cycles before failure, the new "remaining lifespan" may be temporarily stored in volatile memory of internal computerized component 164 and updated within volatile memory for several calculation cycles before persistently storing the calculated "remaining lifespan" on persistent storage medium 150.

Embodiments of the invention may consider other factors or measurements as well. For example, in an embodiment, one or more voltage and/or current sensors 148 may be disposed within power supply 140 so that the current and/or voltage flowing into or out of each power supply 140 may be measured. Certain embodiments may consider the amount of current flowing into or out of a particular power supply 140 in estimating that power supply's remaining lifespan. Similarly, certain embodiments may consider the amount of voltage measured across a particular power supply 140 in estimating that power supply's remaining lifespan.

Note that the weighted set of factors used by internal computerized component 164 to obtain an estimate of a lifespan of a power supply in step 420 may be updated or revised over time. An updated version of the weighted set of factors may be received at RPD 160 over its connection to a communication network such as through an optical network transceiver. Such an updated version may be sent by a technician or repairman or as part of a general upgrade or update of software or operating parameters. Internal computerized component 164 may then subsequently use the updated version of the weighted set of factors henceforth in estimating the lifespan of power supplies.

Certain embodiments may use a different weighted set of factors for different types of power supplies and/or different types of electrolytic capacitors. For example, an embodiment may use a first weighted set of factors to estimate the lifespan of a first power supply, and may use a second weighted set of factors, different from the first set, in estimating the lifespan of a second set of power supplies. In one embodiment, the specific set of factors used in estimating the lifespan of each power supply is stored in persistent storage medium 150 comprised within the power supply itself. In another embodiment, multiple sets of factors used in estimating the lifespan of different power supplies are part of the parameters and algorithms provided to the internal computerized component 164 and stored in its own non-volatile memory. In such a case, internal computerized component 164 may use a power supply type identification obtained from persistent storage medium 150 of the power supply to associate the correct set of parameters with the power supply and use them for estimating the lifespan of that power supply.

In one embodiment, after determining an estimate of the lifespan of a power supply, internal computerized component 164 stores that information in its own persistent storage medium. In another embodiment, internal computerized component 164 may be occasionally replaced during the lifespan of a power supply (for example, due to failure of RPD 160), or the power supply may be moved to another outer housing. Therefore, the estimate of the lifespan of a power supply may be stored within persistent storage medium 150 in the power supply itself rather than in internal computerized component 164. Governed by the algorithms and parameters provided to internal computerized component 164, it may further transmit the estimate of the lifespan of the power supply over its connected network using an optical network transceiver or other type of transceiver. For example, internal computerized component 164 may send an update when the remaining lifespan of the power supply crossed any of a number of predetermined thresholds. The estimate of the lifespan of each power supply of RPN 120 may be sent in this fashion to a technician or monitoring center responsible for maintaining and overseeing the proper operation of RPN 120.

Once a power supply of RPN 120 fails, considerable expense is involved in sending out a repairman in an expedited fashion to replace the power supply. Moreover, having service become unavailable is increasing becoming an unacceptable; consequently, there are considerable financial incentives to ensure the service provided by RPN 120 remains uninterrupted. Embodiments of the invention advantageously provide advance knowledge or forewarning of the remaining lifespan of a power supply of RPN 120. Embodiments of the invention enable power supply replacements to be made on a scheduled basis ahead of failure so that rush service calls and service down time may be avoided.

Figure 5:
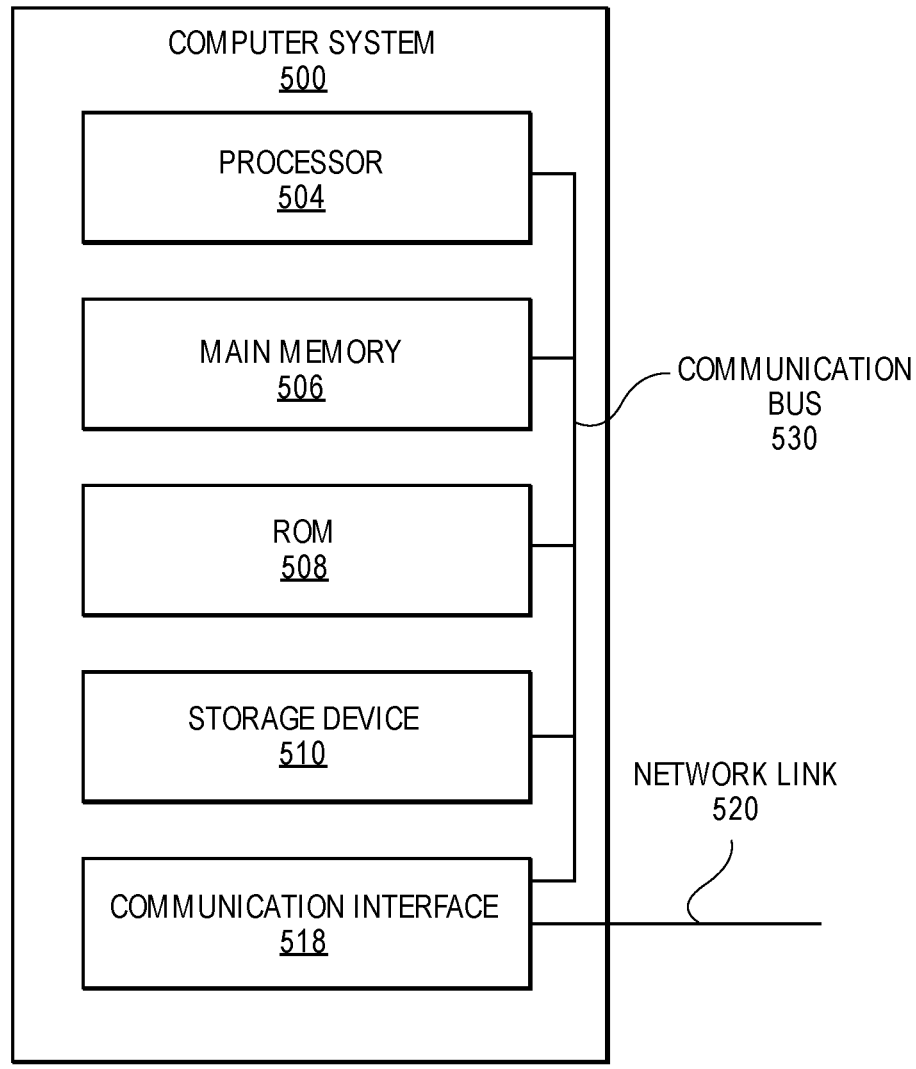
FIG. 5 is a block diagram that illustrates a computer system upon which an embodiment of the invention may be implemented.

FIG. 5 is a block diagram that illustrates a computer system 500, which may be used to implement internal computerized component 164 in an embodiment of the invention. In an embodiment, computer system 500 includes processor 504, main memory 506, ROM 508, storage device 510, communication interface 518, and communications bus 530. Computer system 500 includes at least one processor 504 for processing information. Computer system 500 also includes a main memory 506, such as a random access memory (RAM) or other dynamic storage device, for storing information and instructions to be executed by processor 504. Main memory 506 also may be used for storing temporary variables or other intermediate information during execution of instructions to be executed by processor 504. Computer system 500 further includes a read only memory (ROM) 508 or other static storage device for storing static information and instructions for processor 504. A storage device 510, such as a magnetic disk or optical disk, is provided for storing information and instructions.

Embodiments of the invention are related to the use of computer system 500 for implementing the techniques described herein. According to one embodiment of the invention, those techniques are performed by computer system 500 in response to processor 50 executing one or more sequences of one or more instructions contained in main memory 506. Such instructions may be read into main memory 506 from another machine-readable medium, such as storage device 510. Execution of the sequences of instructions contained in main memory 506 causes processor 504 to perform the process steps described herein. In alternative embodiments, hard-wired circuitry may be used in place of or in combination with software instructions to implement embodiments of the invention. Thus, embodiments of the invention are not limited to any specific combination of hardware circuitry and software.

The term "non-transitory machine-readable storage medium" as used herein refers to any tangible medium that participates in storing instructions which may be provided to processor 504 for execution. Non-limiting, illustrative examples of non-transitory machine-readable media include, for example, a floppy disk, a flexible disk, hard disk, magnetic tape, or any other magnetic medium, a CD-ROM, any other optical medium, a RAM, a PROM, and EPROM, a FLASH-EPROM, any other memory chip or cartridge, or any other medium from which a computer can read.

Various forms of non-transitory machine readable media may be involved in carrying one or more sequences of one or more instructions to processor 504 for execution. For example, the instructions may initially be carried on a magnetic disk of a remote computer. The remote computer can load the instructions into its dynamic memory and send the instructions over a network link 520 to computer system 500.

Communication interface 518 provides a two-way data communication coupling to a network link 520 that is connected to a local network. For example, communication interface 518 may be an integrated services digital network (ISDN) card or a modem to provide a data communication connection to a corresponding type of telephone line. As another example, communication interface 518 may be a local area network (LAN) card to provide a data communication connection to a compatible LAN. Wireless links or optical links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through a network to one or more other computer systems.

Computer system 500 can send messages and receive data, including program code, through the network(s), network link 520 and communication interface 518. For example, a server might transmit a requested code for an application program through the Internet, a local ISP, a local network, subsequently to communication interface 518. The received code may be executed by processor 504 as it is received, and/or stored in storage device 510, or other non-volatile storage for later execution.

Communications 530 is a mechanism for enabling various components of computer system 500 to communicate with one another. In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A non-transitory computer-readable storage medium that stores one or more sequences of instructions for estimating a lifespan of a power supply, which when executed by one or more processors, cause:
   an internal computerized component maintaining a lifespan time value corresponding to an estimated lifespan of the power supply measured in operating hours;
   the internal computerized component periodically obtaining a set of measurements read from said one or more sensors affixed to the power supply; and
   the internal computerized component periodically analyzing said set of measurements using, at least in part, a weighted set of factors, to obtain an estimate of a lifespan of a power supply by decreasing the lifespan time value by a determined amount of time corresponding to how much operational time of the power supply has been depleted since a last calculation cycle for the power supply.

2. The non-transitory computer-readable storage medium of claim 1, wherein said internal computerized component and said power supply both are comprised within a Remote PHY node.

3. The non-transitory computer-readable storage medium of claim 1, wherein said internal computerized component and said power supply both are comprised within a Remote MACPHY node (RMN), an Optical Line Terminal (OLT) node, or a 802.11n Wi-Fi Access Point.

4. The non-transitory computer-readable storage medium of claim 1, wherein execution of the one or more sequences of instructions further cause:

the internal computerized component transmitting the estimate of the lifespan of the power supply over a wireless network using a transceiver.

5. The non-transitory computer-readable storage medium of claim 1, wherein execution of the one or more sequences of instructions further cause:
the internal computerized component transmitting the estimate of the lifespan of the power supply over a network link to a software application that monitors the lifespan of the power supply.

6. The non-transitory computer-readable storage medium of claim 1, wherein said one or more sensors measure temperature of electrolytic capacitors comprised within said power supply.

7. The non-transitory computer-readable storage medium of claim 1, wherein execution of the one or more sequences further comprises:
in response to receiving an updated version of said weighted set of factors over a wireless network, the internal computerized component storing said updated version of said weighted set of factors and subsequently using said updated version of said weighted set of factors to obtain the estimate of the lifespan of the power supply.

8. The non-transitory computer-readable storage medium of claim 1, wherein the power supply is one of a plurality of power supplies, and wherein said plurality of power supplies includes two or more types of power supplies, and wherein said analyzing said set of measurements comprises:
the internal computerized component analyzing said set of measurements using, at least in part, a first weighted set of factors, to obtain a first estimate of a lifespan of a first type of power supply; and
the internal computerized component analyzing said set of measurements using, at least in part, a second weighted set of factors different from said first weighted set of factors, to obtain a second estimate of a lifespan of a second type of a power supply.

9. The non-transitory computer-readable storage medium of claim 1, wherein the weighted set of factors assess an impact that temperature has, over time, upon the lifespan of the power supply.

10. The non-transitory computer-readable storage medium of claim 1, wherein the said one or more sensors include at least one sensor that measures ambient temperature, at least one sensor that measures temperature of a electrolytic capacitor of the power supply, at least one sensor that measure current from or to the power supply, and at least one sensor that measures voltage across the power supply.

11. The non-transitory computer-readable storage medium of claim 1, wherein the internal computerized component uses a previously calculated lifetime estimation stored in said persistent storage medium in conjunction with new measurements to create an updated lifetime estimation which is subsequently stored in the persistent storage medium for future analysis and use.

12. A non-transitory computer-readable storage medium that stores one or more sequences of instructions for estimating a lifespan of a power supply, which when executed by one or more processors, cause:
an internal computerized component periodically obtaining a set of measurements read from said one or more sensors affixed to the power supply; and
the internal computerized component periodically analyzing said set of measurements using, at least in part, a weighted set of factors, to obtain an estimate of a lifespan of a power supply, wherein the updated lifetime estimation is maintained in volatile memory for two or more calculation cycles prior to persistently storing the updated lifetime estimation on the persistent storage medium.

13. An apparatus for estimating a lifespan of a power supply, comprising:
one or more processors; and
one or more non-transitory computer-readable storage mediums storing one or more sequences of instructions, which when executed, cause:
an internal computerized component maintaining a lifespan time value corresponding to an estimated lifespan of the power supply measured in operating hours;
the internal computerized component periodically obtaining a set of measurements read from said one or more sensors affixed to a power supply; and
the internal computerized component periodically analyzing said set of measurements using, at least in part, a weighted set of factors, to obtain an estimate of a lifespan of the power supply by decreasing the lifespan time value by a determined amount of time corresponding to how much operational time of the power supply has been depleted since a last calculation cycle for the power supply.

14. The apparatus of claim 13, wherein said internal computerized component and said power supply both are comprised within a Remote PHY node.

15. The apparatus of claim 13, wherein said internal computerized component and said power supply both are comprised within a Remote MACPHY node (RMN), an Optical Line Terminal (OLT) node, or a 802.11n Wi-Fi Access Point.

16. The apparatus of claim 13, wherein execution of the one or more sequences of instructions further cause:
the internal computerized component transmitting the estimate of the lifespan of the power supply over a wireless network using a transceiver.

17. The apparatus of claim 13, wherein execution of the one or more sequences of instructions further cause:
the internal computerized component transmitting the estimate of the lifespan of the power supply over a network link to a software application that monitors the lifespan of the power supply.

18. The apparatus of claim 13, wherein said one or more sensors measure temperature of electrolytic capacitors comprised within said power supply.

19. The apparatus of claim 13, wherein execution of the one or more sequences further comprises:
in response to receiving an updated version of said weighted set of factors over a wireless network, the internal computerized component storing said updated version of said weighted set of factors and subsequently using said updated version of said weighted set of factors to obtain the estimate of the lifespan of the power supply.

20. The apparatus of claim 13, wherein the power supply is one of a plurality of power supplies, and wherein said plurality of power supplies includes two or more types of power supplies, and wherein said analyzing said set of measurements comprises:
the internal computerized component analyzing said set of measurements using, at least in part, a first weighted set of factors, to obtain a first estimate of a lifespan of a first type of power supply; and
the internal computerized component analyzing said set of measurements using, at least in part, a second weighted set of factors different from said first weighted set of factors, to obtain a second estimate of a lifespan of a second type of a power supply.

21. The apparatus of claim 13, wherein the weighted set of factors assess an impact that temperature has, over time, upon the lifespan of the power supply.

22. The apparatus of claim 13, wherein the said one or more sensors include at least one sensor that measures ambient temperature, at least one sensor that measures temperature of a electrolytic capacitor of the power supply, at least one sensor that measure current from or to the power supply, and at least one sensor that measures voltage across the power supply.

23. The apparatus of claim 13, wherein the internal computerized component uses a previously calculated lifetime estimation stored in said persistent storage medium in conjunction with new measurements to create an updated lifetime estimation which is subsequently stored in the persistent storage medium for future analysis and use.

24. An apparatus for estimating a lifespan of a power supply, comprising:
- one or more processors; and
- one or more non-transitory computer-readable storage mediums storing one or more sequences of instructions, which when executed, cause:
  - an internal computerized component periodically obtaining a set of measurements read from said one or more sensors affixed to the power supply; and
  - the internal computerized component periodically analyzing said set of measurements using, at least in part, a weighted set of factors, to obtain an estimate of a lifespan of a power supply, wherein the updated lifetime estimation is maintained in volatile memory for two or more calculation cycles prior to persistently storing the updated lifetime estimation on the persistent storage medium.

25. A method for estimating a lifespan of a power supply, comprising:
- an internal computerized component maintaining a lifespan time value corresponding to an estimated lifespan of the power supply measured in operating hours;
- the internal computerized component periodically obtaining a set of measurements read from said one or more sensors affixed to a power supply; and
- the internal computerized component periodically analyzing said set of measurements using, at least in part, a weighted set of factors, to obtain an estimate of a lifespan of the power supply by decreasing the lifespan time value by a determined amount of time corresponding to how much operational time of the power supply has been depleted since a last calculation cycle for the power supply.

* * * * *